United States Patent
Jang et al.

(10) Patent No.: US 7,223,657 B2
(45) Date of Patent: May 29, 2007

(54) METHODS OF FABRICATING FLASH MEMORY DEVICES WITH FLOATING GATES THAT HAVE REDUCED SEAMS

(75) Inventors: Won-Jun Jang, Seoul (KR); Jung-Hwan Kim, Gyeonggi-do (KR); Jai-Dong Lee, Gyeonggi-do (KR); Young-sub You, Gyeonggi-do (KR); Sang-Hun Lee, Gyeonggi-do (KR); Hun-Hyeoung Leam, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 11/240,234

(22) Filed: Sep. 30, 2005

(65) Prior Publication Data

US 2006/0073653 A1 Apr. 6, 2006

(30) Foreign Application Priority Data

Oct. 1, 2004 (KR) .................... 10-2004-0078199

(51) Int. Cl.
*H01L 21/336* (2006.01)

(52) U.S. Cl. .................. 438/259; 438/287; 438/284; 438/285; 438/694; 438/696; 257/E29.129; 257/E21.179; 257/E21.687

(58) Field of Classification Search ................ 438/287, 438/259, 284, 285, 647, 694, 696, FOR. 212; 257/E21.129, E21.179, E21.687
See application file for complete search history.

(56) References Cited

U.S. PATENT DOCUMENTS

| 6,448,606 | B1 | 9/2002 | Yu et al. ..................... 257/315 |
| 6,498,064 | B2 | 12/2002 | Tseng .......................... 438/257 |
| 6,620,681 | B1 | 9/2003 | Kim et al. .................. 438/257 |
| 7,064,064 | B2 * | 6/2006 | Chen et al. ................. 438/672 |
| 2005/0142765 | A1 * | 6/2005 | Joo .............................. 438/264 |

* cited by examiner

*Primary Examiner*—George R. Fourson
*Assistant Examiner*—Julio J. Maldonado
(74) *Attorney, Agent, or Firm*—Myers Bigel Sibley & Sajovec

(57) ABSTRACT

Methods of fabricating a floating gate of a flash memory cell are provided in which a first polysilicon layer is formed between first and second isolation layers. An upper region of the first polysilicon layer is then oxidized. The oxidized upper region of the first polysilicon layer is subsequently removed. A second polysilicon layer is formed on the first polysilicon layer. The second polysilicon layer and the first polysilicon layer are patterned to form the floating gate.

21 Claims, 9 Drawing Sheets

METHODS OF FABRICATING FLASH MEMORY DEVICES WITH FLOATING GATES THAT HAVE REDUCED SEAMS

CROSS-REFERENCE TO RELATED APPLICATION

This application claims priority under 35 U.S.C. § 119 from Korean Patent Application No. 10-2004-078199, filed Oct. 1, 2004, the disclosure of which is hereby incorporated by reference herein as if set forth in its entirety.

FIELD OF THE INVENTION

The present invention relates to flash memory devices and, more particularly, to methods of fabricating flash memory devices having improved floating gates.

BACKGROUND OF THE INVENTION

Volatile memory devices, such as dynamic and static random access memory (RAM) devices, are memory devices in which stored data may be lost as time passes. Non-volatile memory devices, such as, for example, read only memory (ROM) devices, electrically erasable and programmable ROM (EEPROM) devices and flash memory devices, are memory devices which maintain stored data over time, even when power to the device is turned off. Typically, non-volatile memory devices exhibit relatively slower data input and output speeds as compared to volatile memory devices.

In recent years, there has been increased demand for integrated circuits that combine multiple devices on a single chip. Representative examples of such devices include merged DRAM amp logic (MDL) devices that combine a DRAM cell and a logic device on a single chip, and merged flash amp logic (MFL) devices that combine a flash memory device and a logic device on a single chip.

Typically, a flash memory cell of a flash memory device has a structure that includes a floating gate, an interlayer dielectric layer, and a control gate on a semiconductor substrate. The flash memory cell may be designed so that a positive voltage that is applied to the control gate is coupled to the floating gate, and electrons in the semiconductor substrate pass through a tunnel oxide layer and are captured in the floating gate by a Fowler-Nordheim (hereinafter, referred to as "F-N") tunneling or hot-carrier injection. The flash memory cell may be erased by applying a negative voltage to the control gate that causes the electrons in the floating gate to return to the semiconductor substrate.

Highly-integrated flash memory devices may eventually replace magnetic disk memory devices because the flash memory devices may have advantages in terms of cell area, access time and power consumption. However, current flash memory devices tend to cost more, per bit of storage, than do magnetic disk memory devices. The cost of flash memory devices may be dependent on, among other things, the number of steps in the fabrication process and the size of individual memory cells. As such, flash memory cells that have a self-aligned shallow trench isolation (hereinafter, referred to as "SA-STI") structure have been developed as they may have reduced spacing between bit lines and therefore smaller memory cells.

FIG. 1 is a cross-sectional diagram of a flash memory cell having a conventional SA-STI structure. As shown in FIG. 1, the flash memory cell has a stacked gate structure, in which a tunnel oxide layer 12 (for F-N tunneling) is formed on a silicon substrate 10. The silicon substrate 10 has STI regions 16 that define a plurality of active regions therebetween. Floating gates 14 are formed on the tunnel oxide layer 12, an interlayer dielectric layer 25 is formed on the floating gates 14, and a control gate 29 is formed on the interlayer dielectric layer 25. An interlayer insulating layer is formed on the control gate 29.

A polysilicon layer, for example, may be used to form the floating gates 14. This polysilicon layer may be patterned so that the floating gates 14 are formed on the active regions and on edge portions of the STI regions 16 that are adjacent the active regions.

The control gates 29 of a plurality of memory cells may be connected to form a word line. The control gates 29 may be composed, for example, of a polycide structure that includes a polysilicon layer 26 and a metal silicide layer 28, which are sequentially stacked.

In the flash memory cell of FIG. 1, data may be stored by applying appropriate voltages to the control gate 29 and the substrate 10 to inject electrons into and out of the floating gate 14. The interlayer dielectric layer 25 maintains the charge in the floating gate 14 and transfers the voltage of the control gate 29 to the floating gate 14.

The interlayer dielectric layer 25 may, for example, comprise a multi-layer structure that includes an oxide layer 20, a nitride layer 22, and a second oxide layer 24 that may have a high dielectric constant that are sequentially stacked. The first oxide layer 20 may be grown, for example, by a thermal oxidation process. The nitride layer 22 may be formed on the first oxide layer 20 by, for example, a low pressure chemical vapor deposition (LPCVD) process. The second oxide layer 24 may be grown, for example, by a thermal oxidation process.

FIGS. 2A to 2D are cross-sectional diagrams illustrating a conventional method of fabricating a non-volatile memory cell. As shown in FIG. 2A, a semiconductor substrate 10 is divided into an active region and a field region 16 by a shallow trench isolation (STI) process. This may be accomplished, for example, by etching a portion of the semiconductor substrate 10 via a trench etch process using an STI hard mask layer to form a trench. A high density plasma (HDP) oxide layer may then be deposited on the entire structure including the trench. The HDP oxide layer is etched until the STI hard mask layer is exposed so that the HDP oxide layer protrudes from the trench. Since the protruded portion of the HDP oxide layer is removed to a predetermined thickness by a wet etch, the HDP oxide layer inside the trench becomes an STI isolation layer 16. As is also shown in FIG. 2A, an oxide layer or an oxynitride layer may then be formed on the active region of the semiconductor substrate 10 to form a tunnel oxide layer (i.e., a gate oxide layer) 12.

Referring to FIG. 2B, a first polysilicon layer 14, which is used as the floating gate, is formed on the tunnel oxide layer 12 by, for example, an LPCVD process. The first polysilicon layer 14 may be formed, for example, by in-situ doping and deposition at a temperature of 600° C. or higher, or by deposition in an LPCVD chamber. A reflection prevention layer 18 (which may comprise, for example, a silicon oxynitride (SiON) layer), is formed on the first polysilicon layer 14. Then, a photoresist layer is deposited on the reflection prevention layer 18. The photoresist layer is exposed and developed to form a photoresist pattern 19 that may be used to expose a portion of the field region 16.

As shown in FIG. 2C, the reflection prevention layer 18 and the first polysilicon layer 14 above the field region 16 may be removed by a dry etch using the photoresist pattern 19 as an etch mask, thereby forming a first polysilicon layer pattern 14a that is separated from a neighboring memory cell in a word line direction (i.e., the first polysilicon layer pattern 14a extends in the same direction as does the field region 16). During the etch process of the first polysilicon layer 14, the remainder of the reflection prevention layer 18 may also be removed.

As shown in FIG. 2D, an ONO interlayer dielectric layer 25 is formed on the first polysilicon pattern 14a and the field isolation layer 16 to insulate the floating gates from a control gate.

Next, a second polysilicon layer (the second polysilicon layer is not illustrated in FIG. 2) that functions as a control gate may be deposited on the ONO interlayer dielectric layer 25. A tungsten silicide layer (also not shown in FIG. 2) may be formed on the second polysilicon layer to improve the conductivity of the control gate. The tungsten silicide layer, the second polysilicon layer, the ONO interlayer dielectric layer 25, and the first polysilicon layer pattern 14a may be dry-etched to form a memory cell having a stacked gate structure including a floating gate 14, an ONO interlayer dielectric layer 25, and a control gate 29.

As shown in FIGS. 2A to 2D, the top surface of the STI isolation layer 16 may be wider than the bottom surface of the STI isolation layer 16 so that the STI isolation layer has a negative vertical inclination. As a result, the first polysilicon layer 14 that is deposited in the portions on the active region between adjacent STI isolation layers 16 has a positive vertical inclination. As shown in FIGS. 2C and 2D, a seam 15 may be generated inside the first polysilicon layer 14 on the active region.

FIG. 3 is a photograph illustrating a section in a conventional flash memory device having an SA-STI structure in which a seam has been generated inside the first polysilicon layer. As shown in FIG. 3, the seam 15 is located inside the first polysilicon layer of the active region. This seam may negatively impact the profile of the ONO interlayer insulating layer that is formed in a subsequent process, which may negatively impact the reliability of the device.

FIG. 4 is a photograph of the ONO interlayer dielectric layer that is formed on the first polysilicon layer of FIG. 3. As shown in FIG. 4, the ONO interlayer dielectric layer 25 has a relatively poor profile 17 as a result of the seam in the polysilicon layer.

SUMMARY OF THE INVENTION

Pursuant to embodiments of the present invention, methods of fabricating a floating gate of a flash memory cell are provided in which a first polysilicon layer is formed between first and second isolation layers. An upper region of the first polysilicon layer is then oxidized. The oxidizing process may, for example, be a wet oxidation process, a dry oxidation process and/or a radical oxidation process. The oxidized upper region of the first polysilicon layer is subsequently removed. A second polysilicon layer is formed on the first polysilicon layer. Finally, the second polysilicon layer and the first polysilicon layer are patterned to form the floating gate.

In certain embodiments of these methods, the first isolation layer and the second isolation layer are spaced apart by a first distance at the bottom surface of the first polysilicon layer. The first polysilicon layer may be on at least edge portions of the first and second isolation layers. The thickness of the first polysilicon layer above the first and second isolation layers prior to the oxidation process may, in certain embodiments, be about half the first distance±about 50 Angstroms. In certain specific embodiments, this thickness may be in the range of about 40 to 60 nm.

The upper surface of the first polysilicon layer may have a positive vertical inclination after the oxidized upper region of the first polysilicon layer is removed. The upper surface of the first polysilicon layer may include a notch-shaped trough after the oxidized upper region of the first polysilicon layer is removed. The oxidized upper region of the first polysilicon layer may have an inverse triangle-shaped profile. The oxidizing step may include oxidizing one or more seams in an upper region of the first polysilicon layer.

The first and second isolation layers may define an active region therebetween. The height of the upper surface of the first polysilicon layer over at least portions of the active region may be lower than the height of the first polysilicon layer over the first and second isolation layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
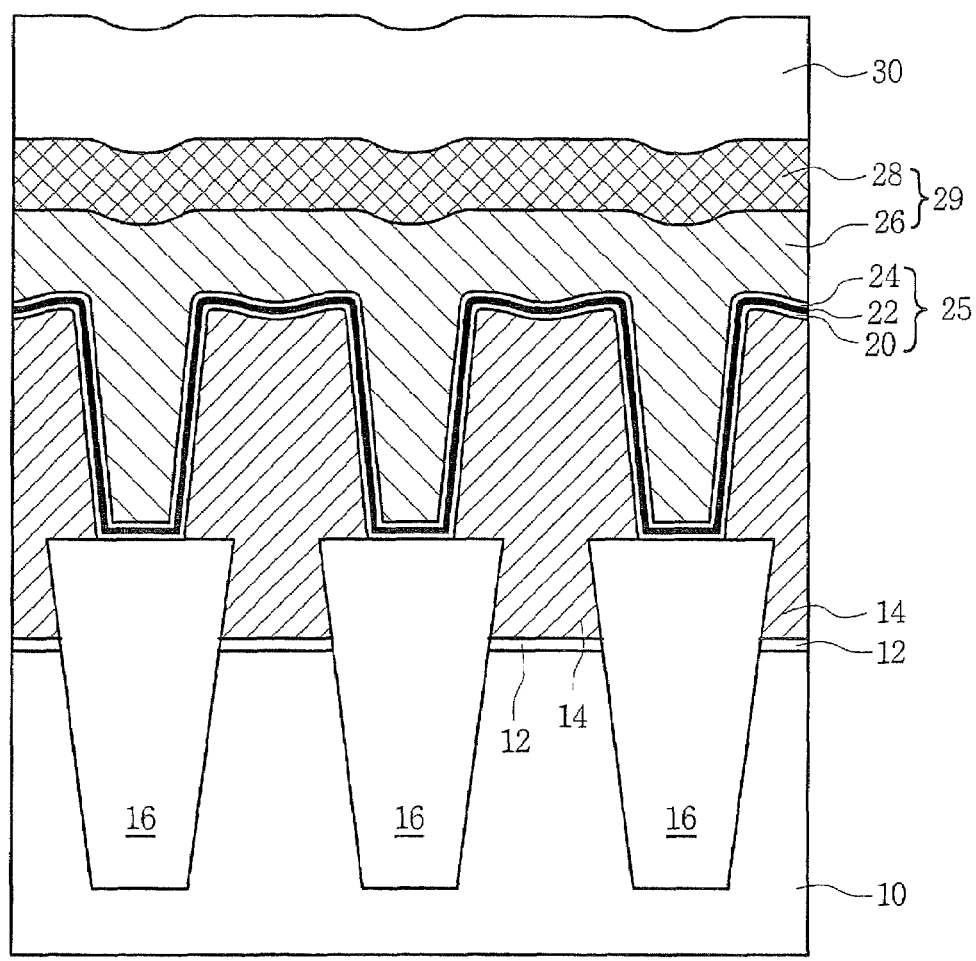
FIG. 1 is a cross-sectional view of a flash memory cell having a conventional SA-STI structure.
Figure 2A:
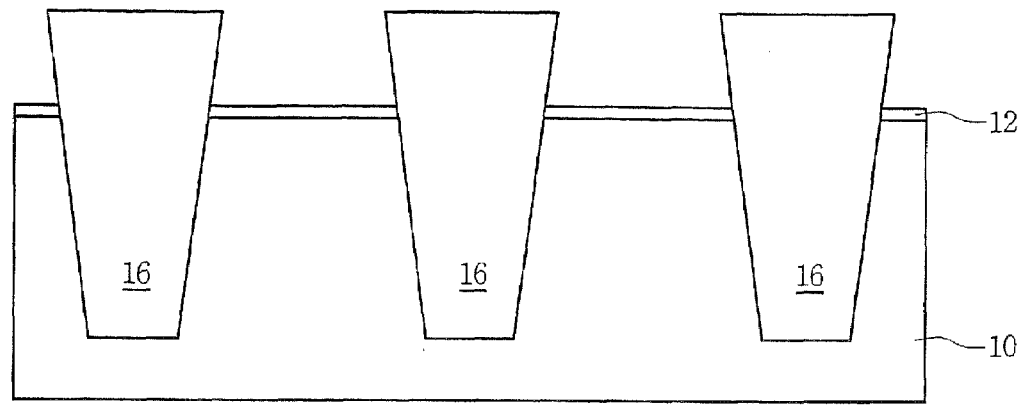
FIGS. 2A to 2D are cross-sectional views illustrating a conventional method of fabricating a non-volatile memory device.
Figure 2B:
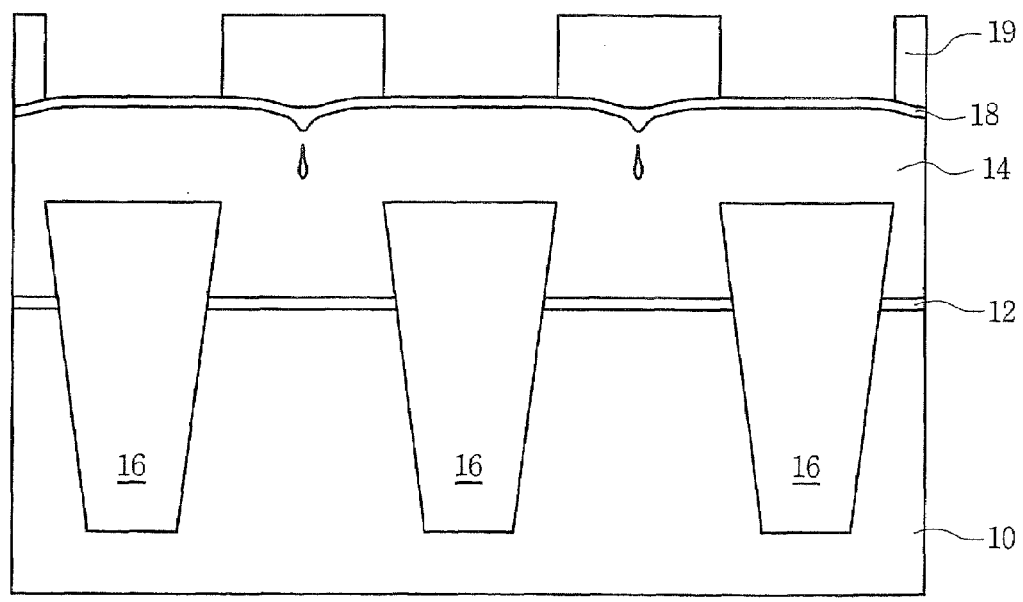
Figure 2C:
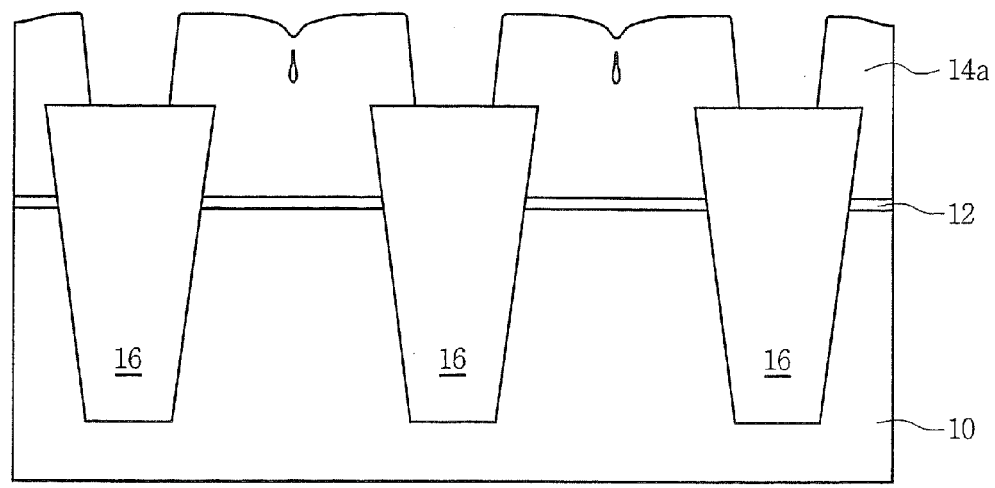
Figure 2D:
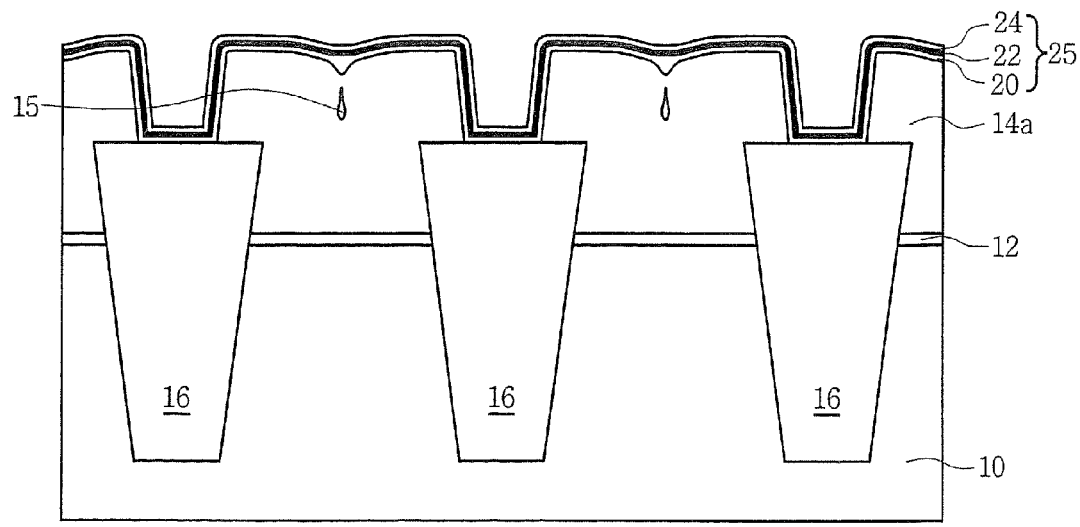
Figure 3:
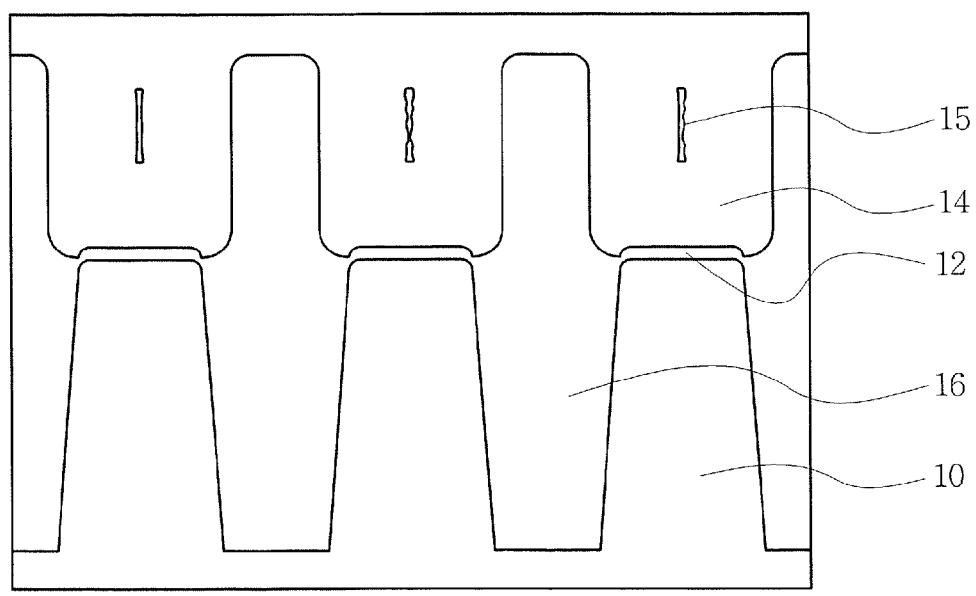
FIG. 3 is a photograph illustrating a section in a conventional flash memory device having an SA-STI structure in which a seam has been generated inside the first polysilicon layer.
Figure 4:
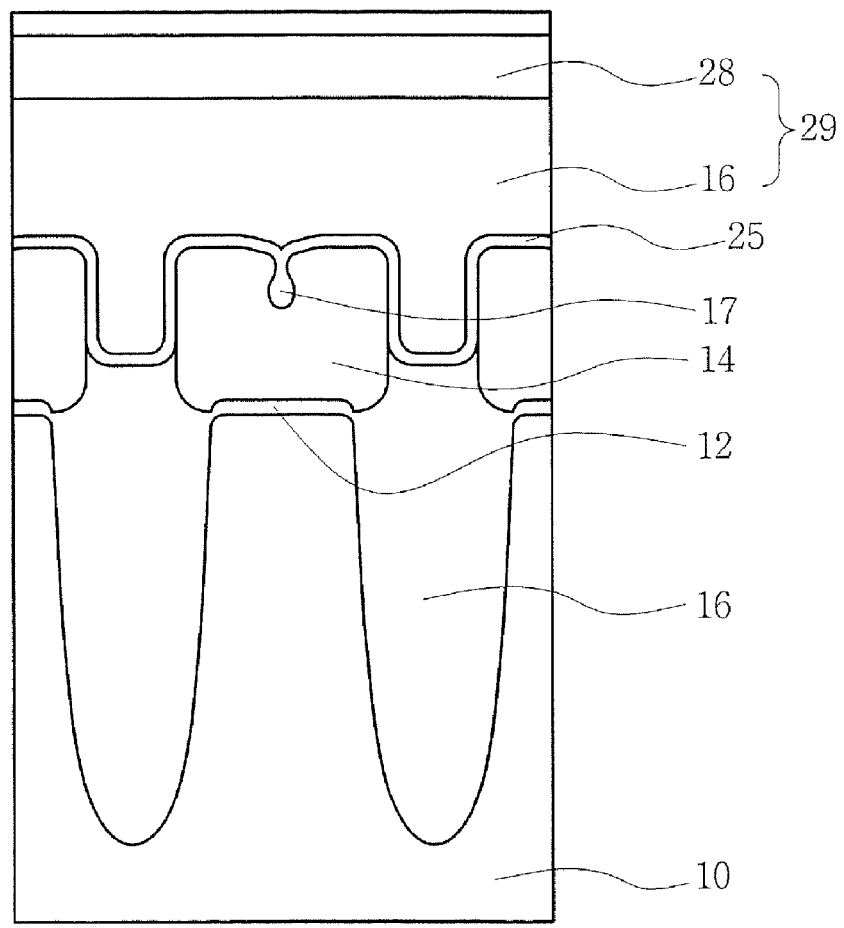
FIG. 4 is a photograph of the ONO interlayer dielectric layer that is formed on the first polysilicon layer of FIG. 3.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", "connected" versus "directly connected" etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 5A:
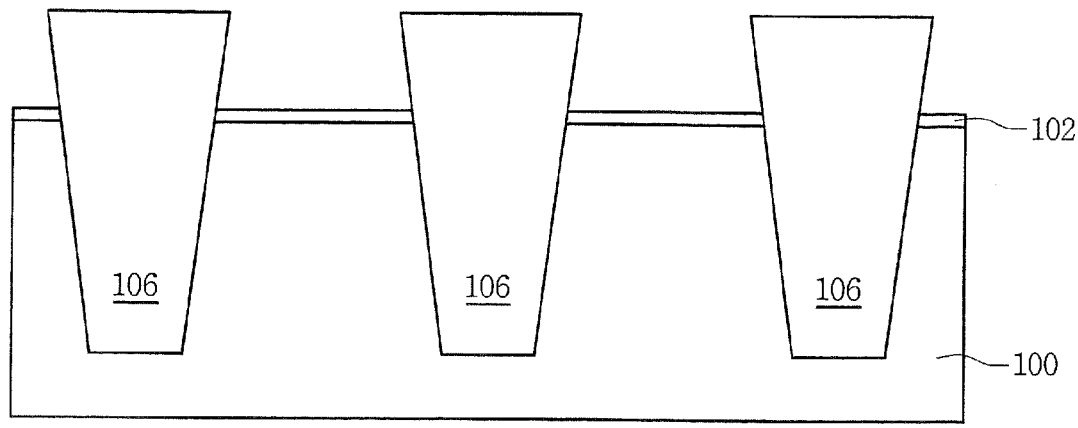
FIGS. 5A to 5F are cross-sectional diagrams illustrating methods of fabricating non-volatile memory devices according to embodiments of the present invention.

FIGS. 5A to 5F are cross-sectional diagrams illustrating methods of fabricating floating gates of non-volatile memory devices according to exemplary embodiments of the present invention. Referring to FIG. 5A, a semiconductor substrate 100 is divided into an active region and a field region 106 by a shallow trench isolation (STI) process. As is shown in FIG. 5A, the STI isolation layer 106 may have a negative vertical inclination. Next, an oxide layer or an oxynitride layer may be grown on the active region of the semiconductor substrate 100 to form a tunnel oxide layer 102 (i.e., a gate oxide layer).

Figure 5B:
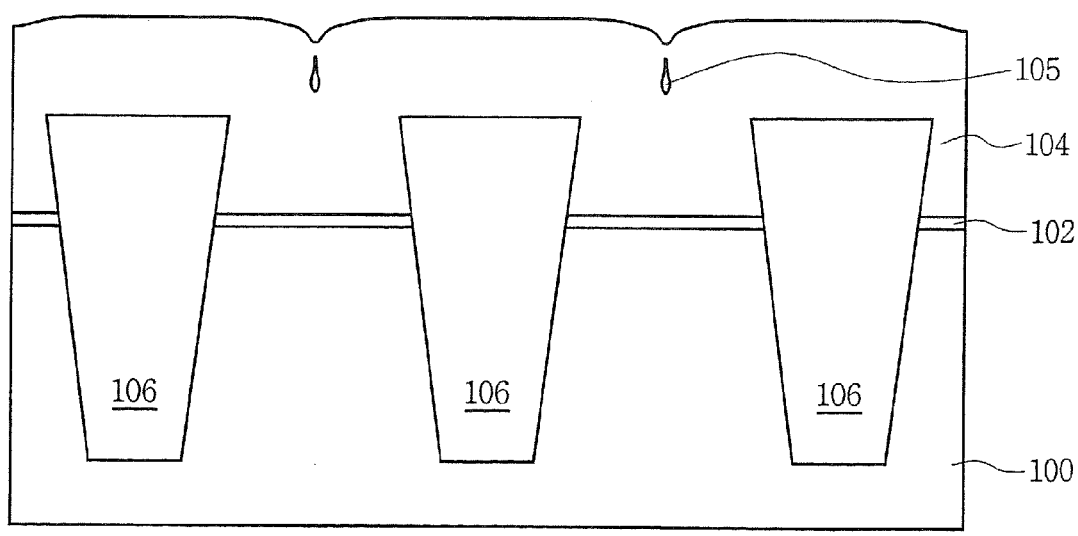

As shown in FIG. 5B, a first polysilicon layer 104 may then be formed on the tunnel oxide layer 102 by, for example, an LPCVD process. When the STI isolation layer 106 has a negative vertical inclination, the first polysilicon layer 104 may have a positive vertical inclination in the space on the active region between adjacent STI isolation layers 106. As a result of this positive vertical inclination, seams 105 may be generated in the first polysilicon layer 104.

Pursuant to embodiments of the present invention, an upper portion of the first polysilicon layer 104 may be oxidized. The oxidation process may comprise, for example, a wet oxidation, dry oxidation, a radical method, or the like. The exposed upper surface of the first polysilicon layer 104 may oxidize relatively quickly, while the portion of the first polysilicon layer 104 adjacent the seam 105 may oxidize more slowly as the oxidation gas may not be directly introduced into the seams. As a result, the oxidation profile may have an inverse triangle shape.

The first polysilicon layer 104 may be formed to have a thickness that is about half the distance between the adjacent STI isolation layers 106. This may reduce or prevent the oxidation gas that is introduced into the seam during the oxidation process from oxidizing the sidewalls of the first polysilicon layer around the seam. In certain embodiments of the present invention, the thickness of the first polysilicon layer may be about half the distance between adjacent STI isolation layers 106±about 50 Angstroms.

Figure 5C:
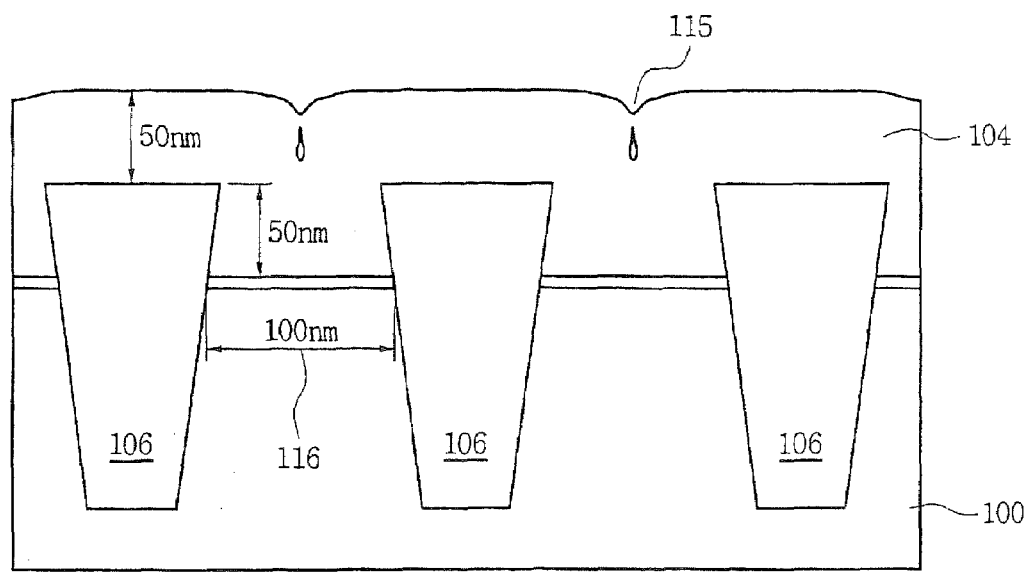

FIG. 5C is a cross-sectional diagram illustrating the thickness of the first polysilicon layer 104 in an exemplary embodiment of the present invention. As shown in FIG. 5C, when the distance 116 between adjacent STI isolation layers 106 is about 100 nm, the upper portion 115 of the first polysilicon layer 104 may have a thickness of about 50 nm above the upper surface of the STI isolation layers 106.

Figure 5D:
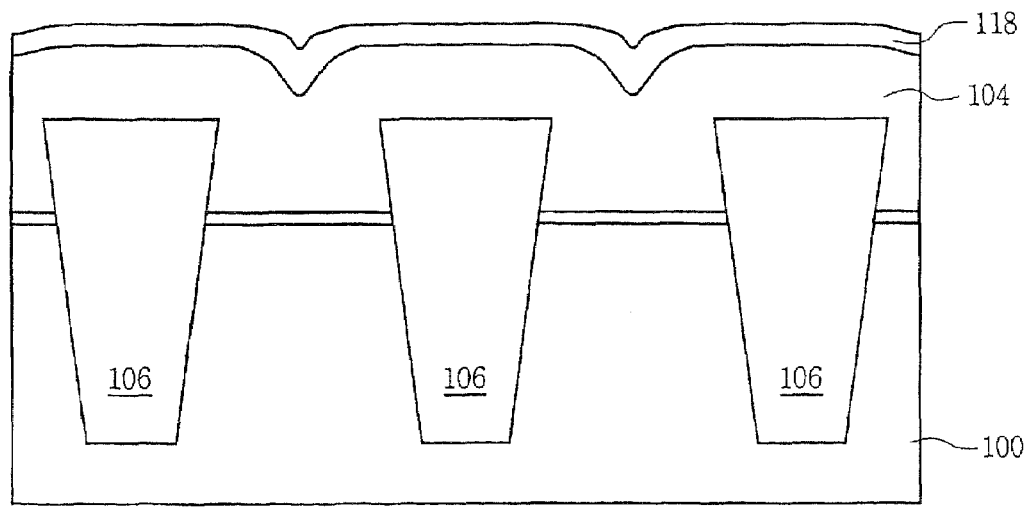
Figure 6:
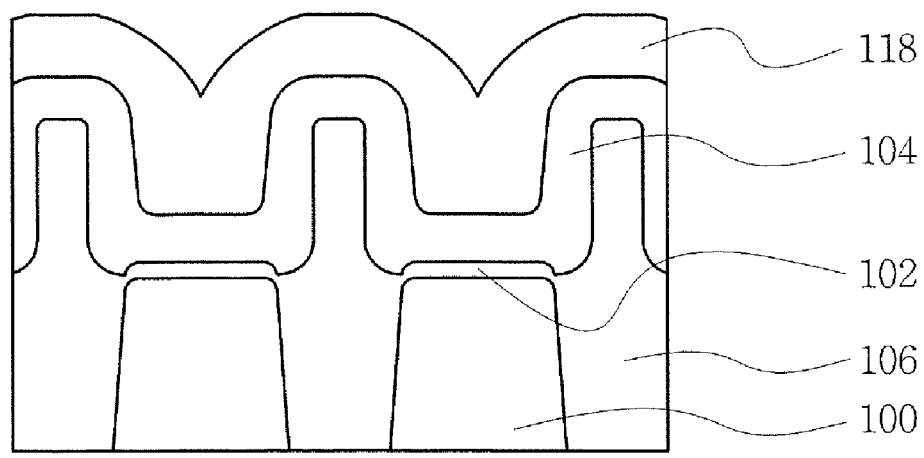
FIG. 6 is a photograph of an oxidized portion of the first polysilicon layer of FIG. 5D.

FIG. 5D is a cross-sectional view and FIG. 6 is a corresponding photograph that illustrate the oxidized portion of the first polysilicon layer 104. As shown in FIGS. 5D and 6, an oxide layer pattern 118 is formed on the upper portions of the first polysilicon layer that has an inverse triangle-shape. The oxide layer pattern 118 includes the seams 115 that were inside the first polysilicon layer 104.

Figure 5E:
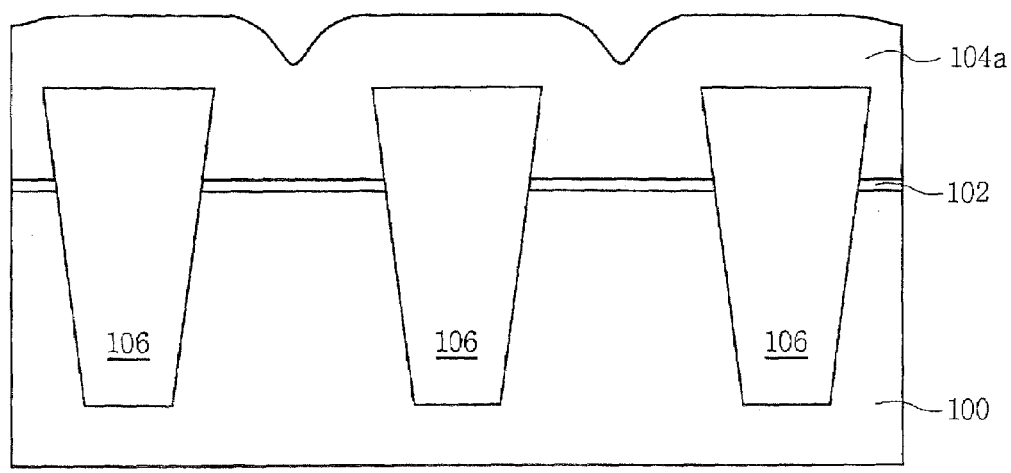

FIG. 5E is a cross-sectional diagram illustrating a shape of the first polysilicon layer 104a after the oxide layer pattern 118 is removed by, for example, a wet etch process using an oxide layer etchant such as LAL. As shown in FIGS. 5C through 5E, the seams 115 that were formed inside the first polysilicon layer 104 are oxidized, and removed by the process of removing the oxide layer pattern 118. The upper surface of the first polysilicon layer 104 has a positive vertical inclination after the oxide layer pattern 118 is removed.

Figure 5F:
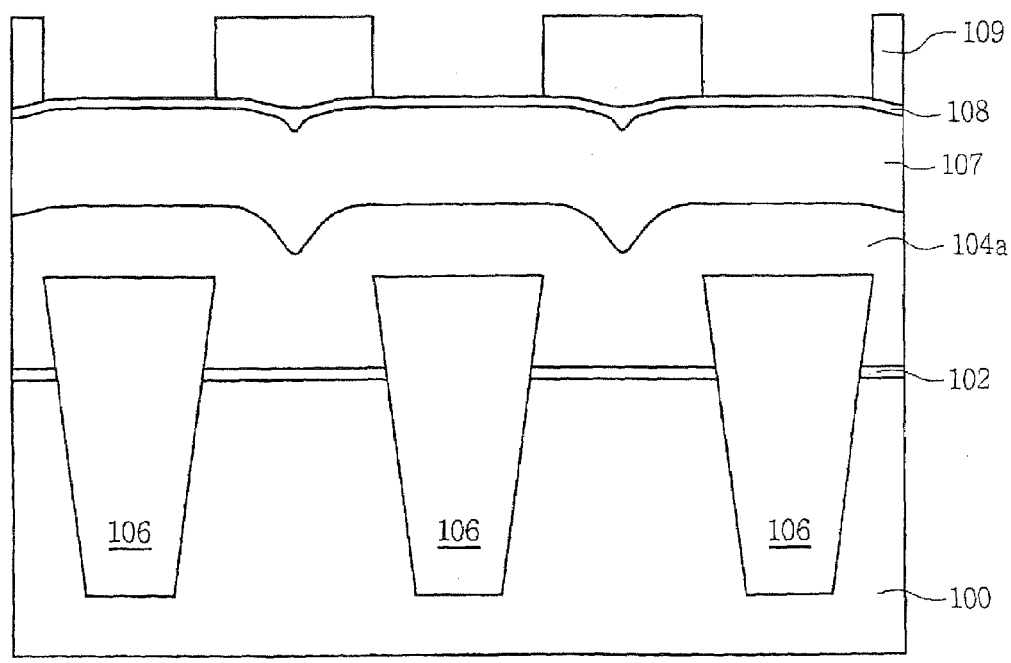

Referring to FIG. 5F, a second polysilicon layer 107 may be deposited on the first polysilicon layer 104a from which the oxide layer pattern 118 is removed. Since the upper surface of the first polysilicon layer 104a has a positive inclination, seams may be avoided during the formation of the second polysilicon layer.

The first polysilicon layer 104a and the second polysilicon layer 107 may be used together as a floating gate.

Next, a reflection prevention layer 108 such as, for example, a silicon oxynitride (SiON) layer, may be formed on the second polysilicon layer 107. A photoresist layer is formed on the reflection prevention layer 108. The photoresist layer may then be exposed and developed to form a photoresist pattern 109.

Portions of the reflection prevention layer 108 and the first and second polysilicon layers 104a, 107 that are exposed by the photoresist pattern 109 may then be removed using, for example, a dry etch with the photoresist pattern 109 serving as the etch mask, to form a first polysilicon layer pattern (not shown in FIG. 5F) that is separated from a neighboring memory cell in the word line direction (i.e., the first polysilicon layer pattern extends in the same direction as does the field region 106). During the process of etching the first polysilicon layer 104a, the reflection prevention layer 108 may also be removed.

Next, an ONO interlayer dielectric layer and a third polysilicon layer (that will be used as a control gate) may be sequentially deposited on the structure (not shown in FIG. 5F). One or more layers such as, for example, a tungsten silicide layer, may also be formed on the third polysilicon layer in order to enhance the conductivity of the control gate. Then, the tungsten silicide layer, the third polysilicon layer, the ONO interlayer dielectric layer, the second polysilicon layer and the first polysilicon layer pattern may be etched to form a memory cell that includes a floating gate, an ONO interlayer dielectric layer, and a control gate. The memory cell may have a structure in which the floating gate and the control gate are stacked with the interlayer dielectric layer therebetween.

The flash memory devices according to embodiments of the present invention may have reduced incidence of seams in the floating gates. As a result, the ONO interlayer dielectric layer that is formed on the floating gate may have a higher degree of reliability.

As described above, pursuant to embodiments of the present invention, seams that may be generated inside a first polysilicon layer due, for example, to a negative inclination of an STI isolation layer, may be partially or completely removed by an oxidation process, and a second polysilicon layer may be formed thereon to form a floating gate that has reduced incidence of seams.

In the drawings and specification, there have been disclosed typical embodiments of the invention and, although specific terms are employed, they are used in a generic and descriptive sense only and not for purposes of limitation. Thus, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A method of fabricating a floating gate of a flash memory cell, the method comprising:
forming a first polysilicon layer between first and second isolation layers;
oxidizing an upper region of the first polysilicon layer;
removing the oxidized upper region of the first polysilicon layer; and then
forming a second polysilicon layer on the first polysilicon layer; and
patterning the second polysilicon layer and the first polysilicon layer to form the floating gate.

2. The method of claim 1, wherein the first isolation layer and the second isolation layer are spaced apart by a first distance at the bottom surface of the first polysilicon layer, and wherein the first polysilicon layer is on at least edge portions of the first and second isolation layers, and wherein a thickness of the first polysilicon layer above the first and second isolation layers prior to the oxidation process is about half the first distance±about 50 Angstroms.

3. The method of claim 1, wherein a thickness of the first polysilicon layer is in the range of about 40 nm to 60 nm.

4. The method of claim 1, wherein an upper surface of the first polysilicon layer has a positive vertical inclination after the oxidized upper region of the first polysilicon layer is removed.

5. The method of claim 1, wherein the oxidized upper region of the first polysilicon layer has an inverse triangle-shaped profile.

6. The method of claim 1, wherein oxidizing an upper region of the first polysilicon layer comprises oxidizing one or more seams in an upper region of the first polysilicon layer.

7. The method of claim 1, wherein the first and second isolation layers define an active region therebetween, and wherein the first polysilicon layer is on at least edge portions of the first and second isolation layers, and wherein the height of the upper surface of the first polysilicon layer over at least portions of the active region is lower than the height of the first polysilicon layer over the first and second isolation layers.

8. The method of claim 1, wherein the upper surface of the first polysilicon layer includes a notch-shaped trough after the oxidized upper region of the first polysilicon layer is removed.

9. The method of claim 1, wherein the first polysilicon layer is formed on an oxide or an oxynitride tunnel oxide layer.

10. The method of claim 1, wherein oxidizing an upper region of the first polysilicon layer comprises performing a wet oxidation process on the upper region of the first polysilicon layer.

11. The method of claim 1, wherein oxidizing an upper region of the first polysilicon layer comprises performing a dry oxidation process on the upper region of the first polysilicon layer.

12. The method of claim 1, wherein oxidizing an upper region of the first polysilicon layer comprises performing a radical oxidation process on the upper region of the first polysilicon layer.

13. The method of claim 1, wherein removing the oxidized upper region of the first polysilicon layer comprises performing a wet etch process on the oxidized upper region of the first polysilicon layer.

14. A method of fabricating a floating gate of a flash memory cell, the method comprising:
forming first and second STI isolation layers in a semiconductor substrate to define an active region and a pair of field regions;
forming a first polysilicon layer between the first and second STI isolation layers, wherein an upper region of the first polysilicon layer includes at least one seam;
oxidizing a portion of the first polysilicon layer, wherein the portion that is oxidized includes the seam; and
removing the oxidized portion of the first polysilicon layer.

15. The method of claim 14, further comprising forming a second polysilicon layer on the first polysilicon layer after the oxidized portion of the first polysilicon layer is removed; and then patterning the second polysilicon layer and the first polysilicon layer to form the floating gate.

16. A method of fabricating a floating gate of a flash memory cell comprising:
forming a pair of STI isolation layers in a semiconductor substrate to define an active region and a pair of field regions;
forming a tunnel oxide layer on the active region;
forming a first polysilicon layer on the tunnel oxide layer and on the pair of STI isolation layers;
oxidizing an upper region of the first polysilicon layer to form an oxide layer on at least a portion of the first polysilicon layer;
removing the oxide layer; and then
forming a second polysilicon layer on the remaining portion of the first polysilicon layer.

17. The method of claim 16, wherein the STI isolation later has a negative vertical inclination.

18. The method of claim 17, further comprising patterning the second and first polysilicon layers to form the floating gate.

19. The method of claim 18, wherein the pair of isolation layers are spaced apart by a first distance, and wherein a thickness of the first polysilicon layer above the first and second isolation layers prior to the oxidation process is about half the first distance±about 50 Angstroms.

20. The method of claim 18, wherein an upper surface of the first polysilicon layer has a positive vertical inclination after the oxidized upper region of the first polysilicon layer is removed.

21. The method of claim 18, wherein oxidizing an upper region of the first polysilicon layer comprises oxidizing one or more seams in an upper region of the first polysilicon layer.

* * * * *